(12) United States Patent
Mallinson et al.

(10) Patent No.: US 9,692,420 B2
(45) Date of Patent: Jun. 27, 2017

(54) PROGRAMMABLE CIRCUIT COMPONENTS WITH RECURSIVE ARCHITECTURE

(71) Applicant: ESS Technology, Inc., Milpitas, CA (US)

(72) Inventors: A. Martin Mallinson, Kelowna (CA); Robert Lynn Blair, Pleasanton, CA (US)

(73) Assignee: ESS Technology, Inc., Milpitas, CA (US)

( * ) Notice: Subject to any disclaimer, the term of this patent is extended or adjusted under 35 U.S.C. 154(b) by 0 days.

(21) Appl. No.: 15/339,617

(22) Filed: Oct. 31, 2016

(65) Prior Publication Data

US 2017/0126231 A1 May 4, 2017

Related U.S. Application Data

(60) Provisional application No. 62/249,483, filed on Nov. 2, 2015, provisional application No. 62/249,490, filed on Nov. 2, 2015.

(51) Int. Cl.
  *H03K 19/173* (2006.01)
(52) U.S. Cl.
  CPC ................................. *H03K 19/173* (2013.01)
(58) Field of Classification Search
  None
  See application file for complete search history.

(56) References Cited

U.S. PATENT DOCUMENTS

| | | | | |
|---|---|---|---|---|
| 2,859,431 A * | 11/1958 | Morris | ............... | G01P 13/0066 315/100 |
| 4,364,116 A * | 12/1982 | Nossek | ............... | H03H 19/004 333/214 |
| 4,471,330 A * | 9/1984 | Naster | ................ | H01P 1/185 333/161 |
| 5,659,257 A * | 8/1997 | Lu | .................... | G01R 31/2813 324/537 |
| 9,302,591 B2 * | 4/2016 | Huang | ................ | H02J 50/05 |
| 2007/0287043 A1 * | 12/2007 | Marsh | ................ | B82Y 30/00 429/431 |
| 2011/0140757 A1 * | 6/2011 | Mallinson | ............ | G06G 7/14 327/356 |
| 2014/0225793 A1 * | 8/2014 | Ikemoto | ............. | H04B 5/0062 343/748 |
| 2015/0372657 A1 * | 12/2015 | Bianchi | ............. | G06F 17/5063 333/130 |

* cited by examiner

*Primary Examiner* — Crystal L Hammond
(74) *Attorney, Agent, or Firm* — Gard & Kaslow LLP

(57) ABSTRACT

A circuit component that is adjustable at run time and a method of designing the circuit are disclosed. The component contains a hierarchy of recursive levels in which a bottom level is a compound element made from two connected simple elements, and each higher level contains two compound elements connected in the same fashion. The described circuit allows for a large number of available values of the component value to be arranged in a logarithmic fashion rather than a linear one as in the prior art, thus generally reducing errors between any desired value for the component and the available values. In addition, such compound elements reduce the power dissipated by the analog element and the susceptibility to noise as compared to prior art adjustable components without adversely affecting the overall gain of the circuit.

11 Claims, 15 Drawing Sheets

PROGRAMMABLE CIRCUIT COMPONENTS WITH RECURSIVE ARCHITECTURE

This application claims priority from Provisional Applications Nos. 62/249,483 and 62/249,490, both filed Nov. 2, 2015, which are incorporated by reference herein in their entirety.

FIELD OF THE INVENTION

The present invention relates generally to adjustable circuits, and more particularly to circuits that can be adjusted at run time.

BACKGROUND OF THE INVENTION

There are a variety of circuits that require programming, i.e., some configuration or adjustment, to achieve desired results. It is known to make programmable components at the time a chip or system is fabricated. For example, field-programmable gate arrays (FPGAs) contain components that during the routing process of chip design are placed in such a way that the connections between them can be changed later, i.e., programmed, to obtain a desired circuit.

However, reconfiguring the connections between components to program a desired circuit takes a certain amount of time and thus is impractical in certain applications. For example, neural-like networks or analog signal processing networks may require more rapid adjustment at run time, i.e., during operation of the circuit, rather than at chip or system fabrication time. In such networks it may be desirable to use analog components that are rapidly changed under some form of digital control. A Digital to Analog converter (DAC) is such a circuit, particularly the multiplying kind of DAC, which multiplies a quantity by a digitally adjustable amount. One manufacturer of such multiplying DACs is Analog Devices, Inc.

Even when such an adjustment is possible at run time, the means by which such an adjustment is made to an analog quantity presents certain issues. Three such issues are 1) whether the adjustment means is inherently linear, 2) whether the adjustment means adversely affects the power dissipated by the analog element, and 3) the degree to which the adjustment increases or decreases the noise present in the circuit.

As one example, consider an "integrator" circuit 100 shown in FIG. 1, which is well known in the prior art. Such a circuit is commonly used to provide an output signal that is the integral of the input signal. A designer selects values for the resistor R1' and the capacitor C1' in order to select how fast the output will respond to a change in the input, known as the "time constant;" the product of the values of the resistor and the capacitor is the time constant, also known as the RC time constant.

Some known ways of adjusting the values of the components after the circuit has been constructed are illustrated in FIGS. 2 to 5. For example, it is possible to make the effective value of either the capacitor C1' or the resistor R1' in FIG. 1 adjustable by building it out of binary weighted values; as will be explained further below, opening and closing switches S1 to S4 in each of FIGS. 2 to 5 will adjust the effective value of capacitor C1' or resistor R1', respectively.

However, as will also be explained further, in these cases the values achievable are distributed linearly across the given range. While it is typical that in a given design the variation in the absolute value of a component determines the circuit performance, those of skill in the art will appreciate that a linear distribution of possible values means that the percentage of error at the low end of the range may often be greater than at the high end of the range.

For example, in circuit 200 of FIG. 2 four capacitors are used to create an adjustable capacitance to replace single capacitor C1' of FIG. 1. The values of these four capacitors are selected relative to some nominal capacitance C, and are $\frac{1}{2}$, $\frac{1}{4}$, $\frac{1}{8}$, and $\frac{1}{16}$ of the nominal capacitance C, respectively. Switches S1 to S4 may each be either open or closed. If a switch is open, the corresponding capacitor does not contribute to the circuit; if the switch is closed, the corresponding capacitor contributes to the effective capacitance that corresponds to capacitor C1' in FIG. 1. If all four switches are open, the effective capacitance is zero, no current flows, and the circuit does not operate.

By opening and closing switches S1 to S4, the effective non-zero value of C1' may range from $\frac{1}{16}$ C to $\frac{15}{16}$ C, with a resolution (i.e., steps in value) of $\frac{1}{16}$ C distributed linearly across the range. These values may be represented by a control signal or code corresponding to which of the switches S1 to S4 are open or closed, and may be represented in binary form. Thus, $\frac{1}{16}$ C is represented by a 1 (binary 0001), i.e., only switch S1 is closed, and $\frac{15}{16}$ C is represented by a 15 (binary 1111), meaning all 4 switches are closed; a control code of 0 (binary 0000) means all 4 switches are open, and the effective capacitance is 0. (The effective impedance of capacitors in parallel is calculated in the same way as the effective capacitance, and thus the distribution of impedance values is also linear.)

Suppose a designer using the circuit of FIG. 2 wants the effective value of the capacitors to be 0.28 C. The closest that the circuit of FIG. 2 can come to this desired effective value is either 0.25 C (closing only switch S3, i.e., a code of 4 or 0100), or 0.3125 C ($\frac{5}{16}$ C, closing switches S3 and S1, a code of 5 or 0101). Selecting 0.25 C as the closest value to the desired value of 0.28 C results in an error of 0.03 C, or 10.7% of the desired effective value of C1 (0.03/0.28 =10.7%).

However, if the designer wants a value of 0.85 C, the two closest values achievable with the circuit of FIG. 2 are 0.8125 C (code 13, or 1101) or 0.875 C (code 14, or 1110). Selecting 0.875 C means the error from the desired value is 0.025, or 2.9% (0.025/0.85=2.9%). This is a significantly smaller error.

It is known in the art that, as in the example above, the error as a proportion of the desired value varies because the possible values are linearly distributed across the range. It is believed that all of the prior art adjustable components have this limitation.

As will be discussed further below, the prior art methods of adjusting components also have other undesirable limitations. For example, power is wasted by the adjustable components, and there is unwanted thermal noise present in the circuit.

It would be advantageous to have adjustable components that are adjustable at run time, that provide a more consistent error across the components' range(s), that reduce the power dissipated as the controlled parameter is reduced, and that reduce noise, all without adversely affecting the performance of the circuit containing them.

SUMMARY OF THE INVENTION

A circuit and method of making a circuit is described that allows adjustment of an analog element at run time. The described circuit allows adjustment in a logarithmic fashion rather than a linear one as in the prior art, while reducing the power dissipated by the analog element, while reducing the susceptibility to noise and not adversely affecting the gain of the circuit.

One embodiment is an adjustable circuit component comprising: a first two-port compound element containing first and second simple elements each having an impedance, a first plurality of switches that are configured to be separately opened or closed so as to connect the first and second simple elements either in series or in parallel, and a first control input for accepting a first control signal that causes the first plurality of switches to be opened or closed; a second two-port compound element containing third and fourth simple elements each having an impedance, a second plurality of switches that are configured to be separately opened or closed so as to connect the third and fourth simple elements either in series or in parallel, and a second control input for accepting a second control signal that causes the second plurality of switches to be opened or closed; and a third two-port compound element containing the first and second two-port compound elements, a third plurality of switches that are configured to be separately opened or closed so as to connect the first and second two-port compound elements either in series or in parallel, and a third control input for accepting a third control signal that causes the third plurality of switches to be opened or closed.

Another embodiment is a method of designing an adjustable circuit component, comprising the steps of: electing a desired number of possible values of the adjustable circuit component; selecting a nominal impedance value; specifying a zero level two-port compound element containing first and second simple elements each having an impedance of the nominal impedance value, a first plurality of switches that are configured to be separately opened or closed so as to connect the first and second simple elements either in series or in parallel, and a first control input for accepting a first control signal that causes the first plurality of switches to be opened or closed; specifying a first level two-port compound element containing two instances of the zero level compound element, a second plurality of switches that are configured to be separately opened or closed so as to connect the two zero level compound elements either in series or in parallel, and a second control input for accepting a second control signal that causes the second plurality of switches to be opened or closed; specifying a higher level two-port compound element containing two instances of a lower level compound element, a third plurality of switches that are configured to be separately opened or closed so as to connect the two lower level compound elements either in series or in parallel, and a third control input for accepting a third control signal that causes the third plurality of switches to be opened or closed; repeating the step of specifying a higher level two-port compound element containing two instances of a lower level compound element until the number of possible values of the highest level compound element is equal to or greater than the desired number of possible values of the adjustable circuit component.

DETAILED DESCRIPTION OF THE INVENTION

Described herein is a circuit, and a method of constructing the circuit, that allows adjustment of an analog element at run time. The described circuit allows adjustment in a logarithmic fashion rather than a linear one as in the prior art, while reducing the power dissipated by the analog element and the susceptibility to noise without adversely affecting the overall gain of the circuit. A logarithmic distribution of possible values is believed to be desirable, as it makes the proportional error between any desired value and the closest possible value more consistent across the range.

The circuit is built upon a structure that is defined recursively, i.e., upon a design wherein elements of a structure are themselves the same structure. By using such a recursive connection of programmable elements, the value of the analog element can be easily adjusted without the limitations of prior art solutions.

Figure 1:
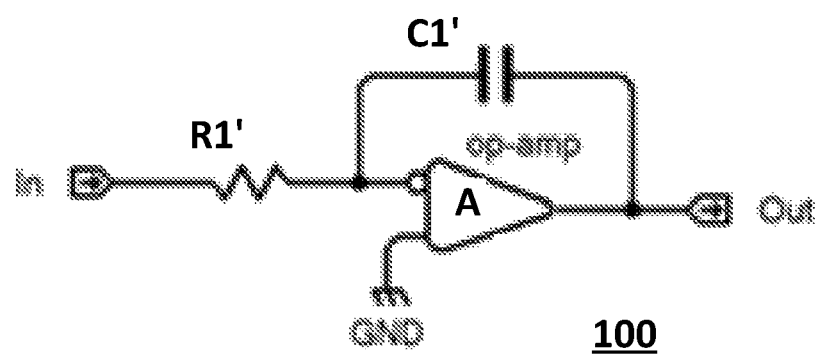
FIG. 1 is a diagram of an integrator circuit of the prior art.

As above, in the various prior art circuits of FIGS. 2 to 5, switches S1 to S4 may be closed, for example under digital control, to vary the effective value of the capacitor or the resistor in an integrator circuit such as that of FIG. 1.

Figure 2:
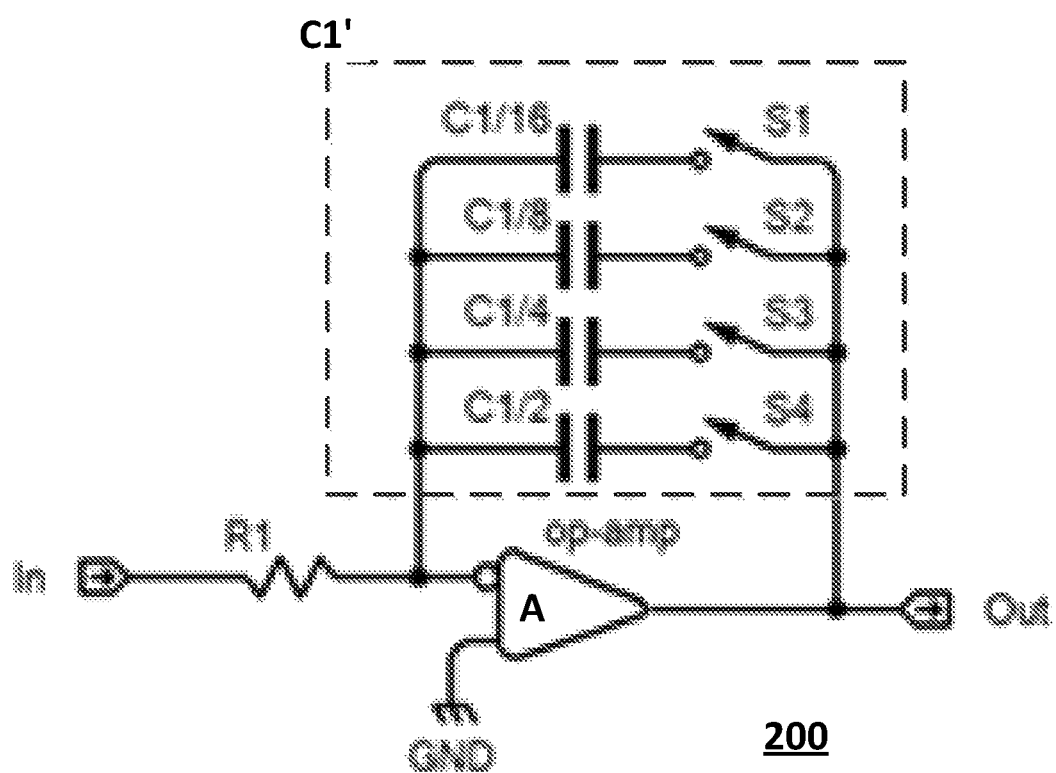
FIG. 2 is a diagram of one implementation of an integrator circuit in which the effective value of the capacitor may be adjusted as known in the prior art.
Figure 3:
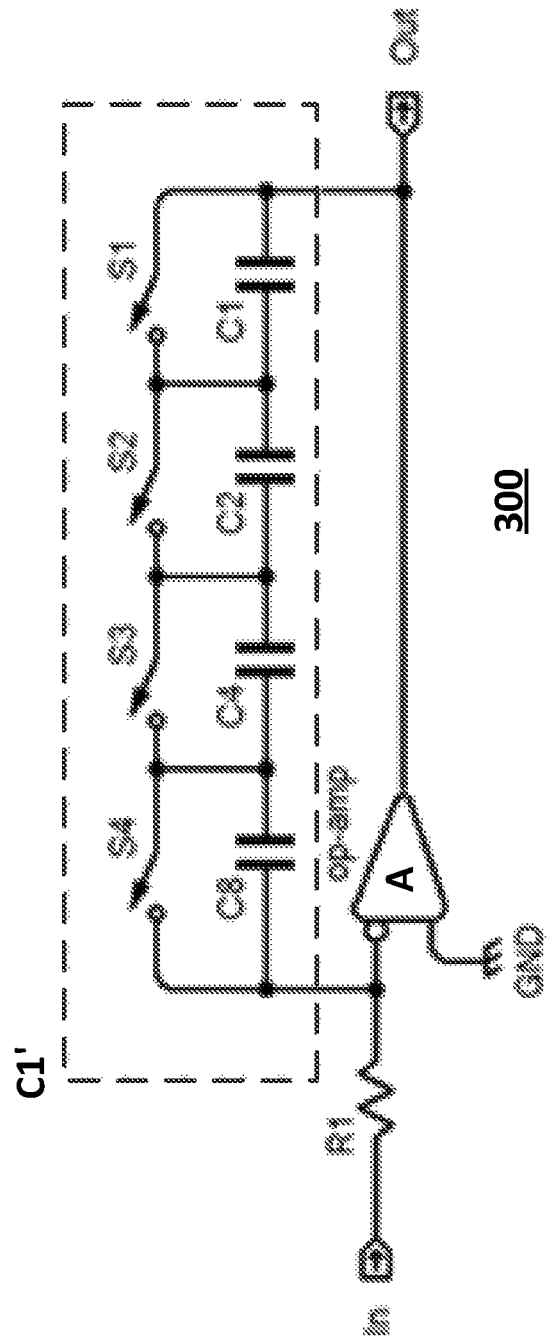
FIG. 3 is a diagram of another implementation of an integrator circuit in which the effective value of the capacitor may be adjusted as known in the prior art.

As was described with respect to circuit 200 in FIG. 2, the capacitors, when considered as providing either capacitance or impedance, provide a linear distribution of values. The circuit of FIG. 3 shows an alternative configuration in which the capacitors are placed in series rather than in parallel. As shown, in the series configuration the capacitors have capacitances of 1, 2, 4, and 8 times a nominal capacitance C.

In circuit 300 of FIG. 3, switches S1 to S4 may again each be either open or closed. If a switch is open, current will flow through the corresponding capacitor rather than through the switch, while if a switch is closed, current will flow through the switch and around the corresponding capacitor. Again the four capacitors of the indicated values can provide 15 different combinations and thus 15 different values. (If all four switches are closed, there will be no effective capacitance, just a direct connection around the capacitors from the output of op-amp A to the inverting input of the op-amp A.)

The circuit 300 of FIG. 3 also results in a linear distribution of values, whether the capacitors are considered as providing either capacitance or admittance (as compared to impedance in the parallel configuration of capacitors of FIG. 2), and will suffer from the same non-constant proportional error between a desired value and an actual value as the circuit 200 of FIG. 2.

Other ways of making adjustments to an integrator circuit are known in the prior art. The resistor R1' of circuit 100 of FIG. 1 may be adjusted in a similar way that the value of C1 in FIG. 1 may be adjusted by the circuits 200 and 300 of FIGS. 2 and 3. One of skill in the art will easily understand how to place resistors in series or parallel to create an effective resistance that is adjustable and that corresponds to R1' in circuit 100 of FIG. 1.

A different form of adjustment of R1' of FIG. 1 is possible in connection with a multiplying DAC. One example of such a circuit with a multiplying DAC is shown in circuit 400 in FIG. 4. In circuit 400, resistors R3, R4, R5 and R6 are all twice the value of resistors R1 and R2, and make a well-known multiplying DAC configuration. One of skill in the art will appreciate that this 2:1 ratio allows the resistor network to have different values in fractional steps as in circuits 200 of FIGS. 2 and 300 of FIG. 3 above, and thus, in combination with the value of capacitor C1, allows circuit 400 to have different time constants. It will further be appreciated that the nominal value R of resistors R1 and R2 may be chosen, again in combination with the value of C1, based upon the desired center of the range of adjustment of the time constant.

Now the effective value of the resistor feeding the input signal to op-amp A, again equivalent to resistor R1' of FIG. 1, may be adjusted by using switches S1 to S4 to connect the input to the circuit In to the inverting input of the op-amp A or to ground. As with the circuits 200 and 300 of FIGS. 2 and 3, however, this results in achievable values that are linearly placed, and again thus suffers from the problem described above that the proportional error is not constant across the range of the circuit.

Figure 4:
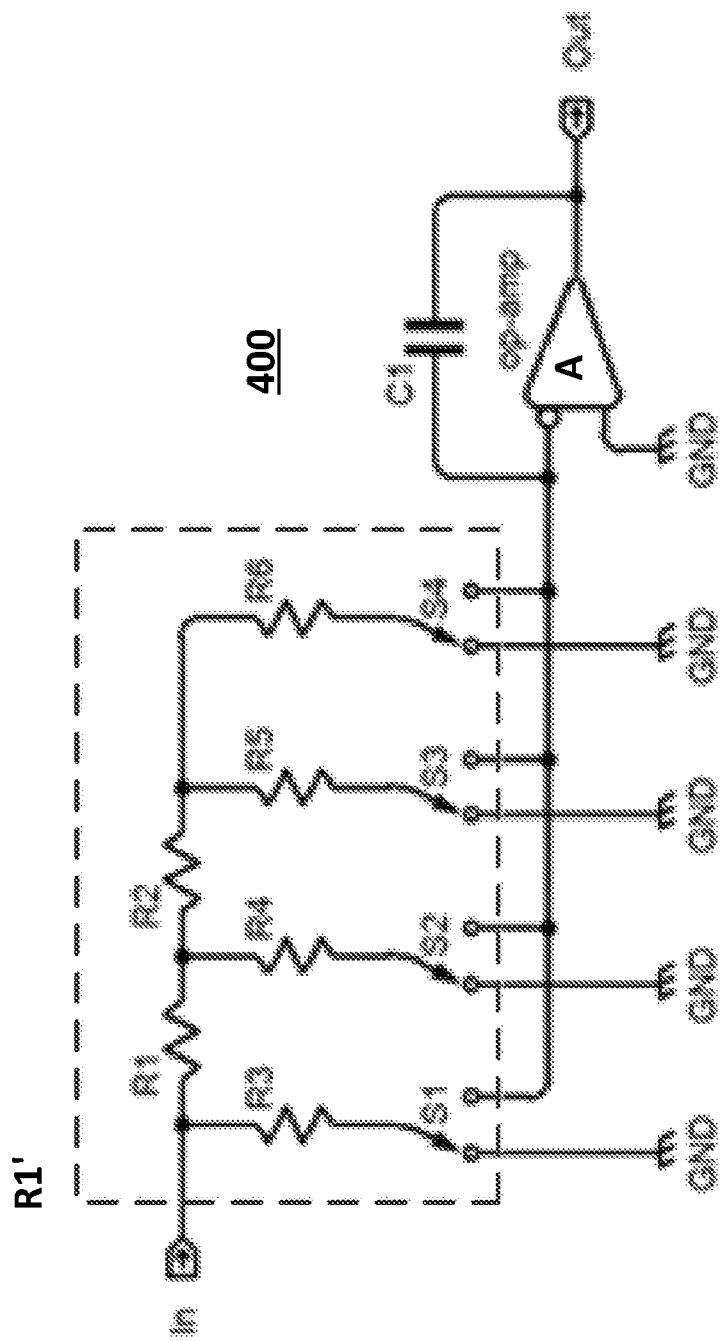
FIG. 4 is a diagram of one implementation of an integrator circuit in which the effective value of the resistor may be adjusted as known in the prior art.

In addition to this, the prior art multiplying DAC circuit 400 of FIG. 4 is wasteful of current, and thus power. As is known in the art and apparent from FIG. 4, the device driving the input port sees a constant resistance regardless of which effective resistance is selected, since current always flows through all of the resistors. However, any current not directed to op-amp A is not used and flows to ground and is wasted. Since all four switches S1 to S4 connect the input to ground in FIG. 4, no signal flows to op-amp A but rather all of the input current flows to ground and is wasted.

As mentioned above, another issue is thermal noise in the circuit, which may be represented as an unwanted signal that appears at the output from the amplifier along with the amplified input signal. As is known in the art, a manufacturer will typically specify noise as an additional voltage at the input to the amplifier; the difference between the additional input voltage and the portion of the output voltage not due to amplification of the input signal is described as noise gain, and may be different from the gain of the amplifier because the noise sees a network that is not the same as the network seen by the input signal.

Figure 5:
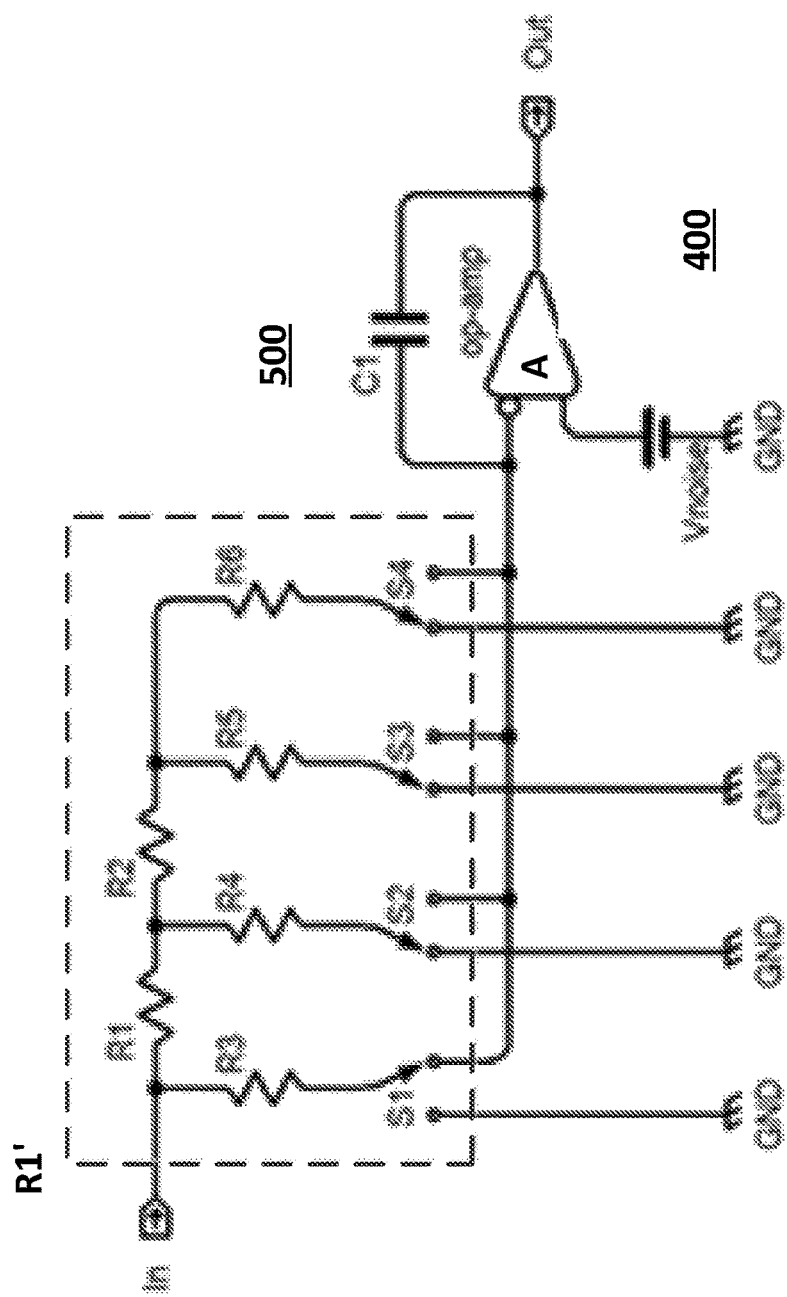
FIG. 5 is a diagram of the implementation of an integrator circuit of FIG. 4 in a different operating condition.

Circuit 500 in FIG. 5 shows the circuit 400 of FIG. 4 with switch S1 now activated to be in a position that allows current to flow through S1 to op-amp A rather than to ground; the current through switches S2, S3 and S4 is still directed to ground and wasted. In this configuration, the effective value of the resistor to the input of op-amp A (i.e., R1' in FIG. 1) is about one-eights of its maximum value; if the effective resistance can range from 1 to 16 times a nominal resistance R as is typical in the art, then the configuration of FIG. 5 has an effective resistance of 2 times R since current only flows to op-amp A through resistor R3.

Figure 6:
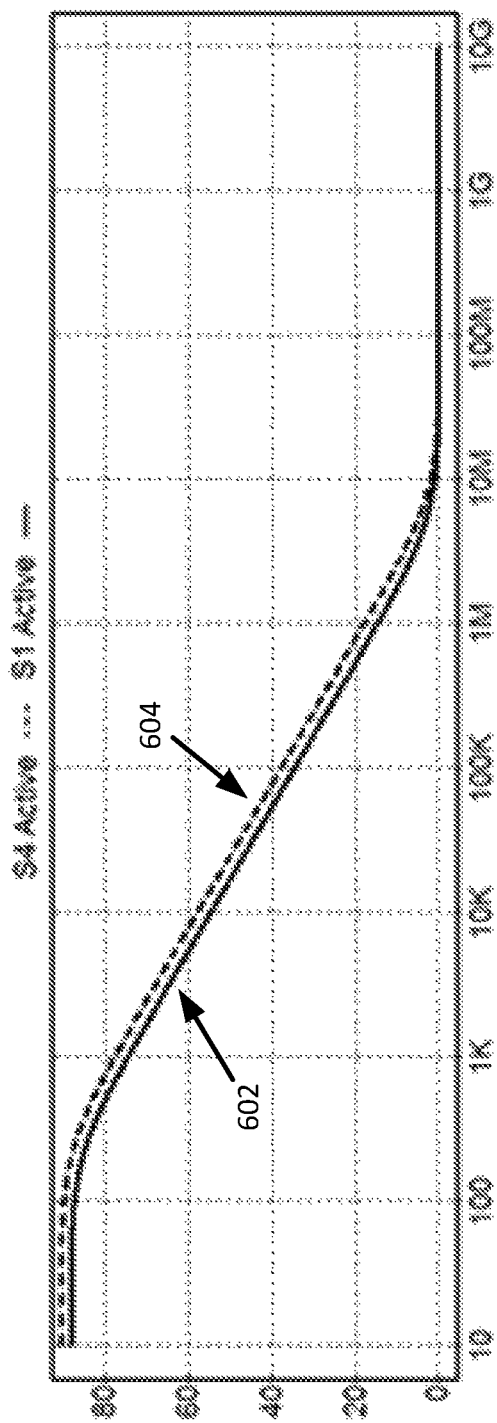
FIG. 6 is a graph of a comparison of noise in a prior art integrator circuit such as that of FIG. 4 in two different operating configurations.

FIG. 6 shows a comparison of noise in circuit 500 of FIG. 5 with noise in another circuit 400 of FIG. 4, but with the switches in a different configuration (not shown) than that of FIG. 5, one in which only switch S4 is activated to pass current to op-amp A, rather than switch S1. Passing current through only S4 rather than only S1 maximizes the effective resistance between the input and op-amp A (i.e., again R1' in FIG. 1) to a value of 16 times R, as compared to the effective resistance in FIG. 5 of 2 times R.

Any noise Vnoise present at the input will appear at the output with some gain. In FIG. 6, the solid line 602 shows the difference in response from Vnoise to the output in decibels (db), i.e., the gain, at each frequency in a range from 10 hertz (Hz) to 10 gigahertz (GHz), i.e. 10 trillion hertz for circuit 500 of FIG. 5, while the dashed line 604 shows the noise for the alternative configuration in which only switch S4 passes current to op-amp A.

It can be seen in FIG. 6 that maximizing the effective resistance between the input and op-amp A in circuit 400 increases the gain of the noise, and thus results in worse performance, at any given frequency up to approximately 10 megahertz (MHz). (As the frequency gets higher than that, the noise is filtered out and thus goes toward zero.) For example, at 1 kilohertz (KHz), the noise is increased about 72 db when the effective input resistance is 2 R, and about 78 db when the effective input resistance is maximized at 16 R. This is also related to the wasted current to ground described above.

One of skill in the art will not be surprised by this, as it is known that the noise gain of circuit 400 is poor, and that the noise gain will go up as the longer time constant (resulting from increasing the effective input resistance) slows down the integrator.

The present invention addresses the concerns described above by using a circuit that is built upon a structure that is defined recursively, and allows the value of an analog element to be easily adjusted without the limitations of prior art solutions.

Figure 7:
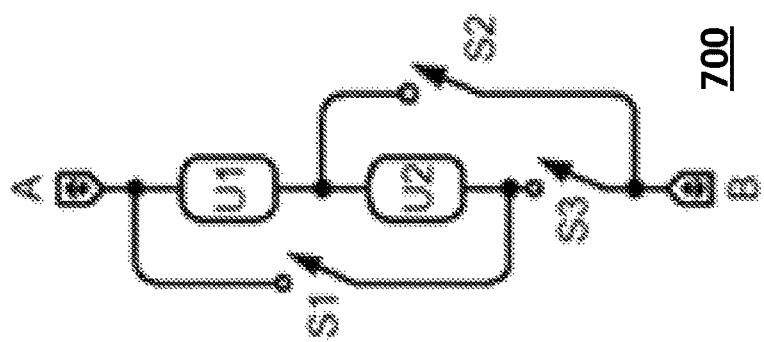
FIG. 7 is a block diagram of a recursive element according to one embodiment.

FIG. 7 is a block diagram of a simple compound element 700 according to one embodiment. Compound element 700 has two ports A and B, and contains two "simple" elements U1 and U2, each having an impedance (the impedance values are also called U1 and U2 below), and three switches S1, S2 and S3. Simple elements U1 and U2 may be any element having impedance, for example, resistors, capacitors, inductors, or field effect transistors (FETs).

A "simple" element is one in which the element has two ends when placed in a larger circuit, so that any current flowing into one end of the element must flow out of the other end, and there is no switch or mechanism contained within the element by which it can be adjusted or programmed. Since there is no ability to adjust the element, once it is made its value is thus fixed. In its simplest form, a simple element is a single component such as a resistor, capacitor, inductor or FET; however, even a combination of such devices may be a "simple element" within the definition herein if it appears to the larger circuit that the combination has only two ends and it cannot be adjusted once designed or made.

By opening or closing the switches, it is possible to select from five different values of impedance for compound element 700. The following Table 1 indicates the five possible impedance values, and the positions of switches S1, S2 and S3 for each value. In Table 1, an X symbol is a "don't care," i.e., it does not matter whether the switch is open or closed, a + symbol means U1 and U2 are in series, and a ∥ symbol means U1 and U2 are in parallel:

TABLE 1

| Selection | S1 | S2 | S3 | Impedance |
|---|---|---|---|---|
| 1 | X | Open | Open | Infinite |
| 2 | Open | Closed | X | U1 |
| 3 | Closed | Closed | Open | U1 ∥ U2 |
| 4 | Open | Open | Closed | U1 + U2 |
| 5 | Closed | X | Closed | 0 |

Thus, for example, if switches S2 and S3 are open, no current can flow from A to B and the impedance is infinite; it does not matter whether switch S1 is open or closed. If switches S1 and S3 are closed, current flow from A to B with no resistance, and it does not matter whether switch S2 is open or closed. The other possible switch positions and resulting impedances are as shown.

In order to select one of 5 possible states, a three-bit control signal is used, although three of the eight possible values of the 3-bit control signal need not be used. In a simpler embodiment now described, only two of the possible five states of compound element 700 are used, selections 3 and 4 in the table above, i.e., U1 and U2 in parallel and U1 and U2 in series. Thus, a single bit control signal, called C, will suffice to select between these two states. One value of the control signal C, for example low or 0, will close switches S1 and S2 and open switch S3, resulting in U1 and U2 being in parallel. The opposite value of the control signal C, in this case high or 1, will open switches S1 and S2 and close switch S3, resulting in U1 and U2 being in series.

Figure 8:
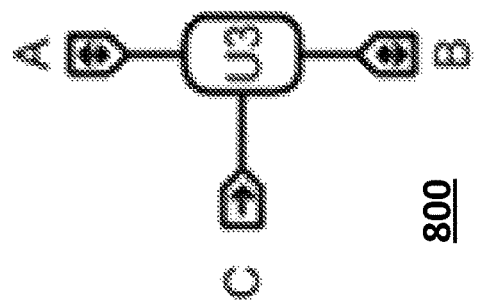
FIG. 8 is a higher level block diagram of the recursive element of FIG. 7.

FIG. 8 is a higher level block diagram 800 of the compound element 700, which does not show the contained simple elements U1 and U2, but only the combination of U1 and U2 as a single compound element U3, with ports A and B and a control port C for the single bit control signal that selects the positions of switches S1, S2 and S3 as described above.

Figure 9:
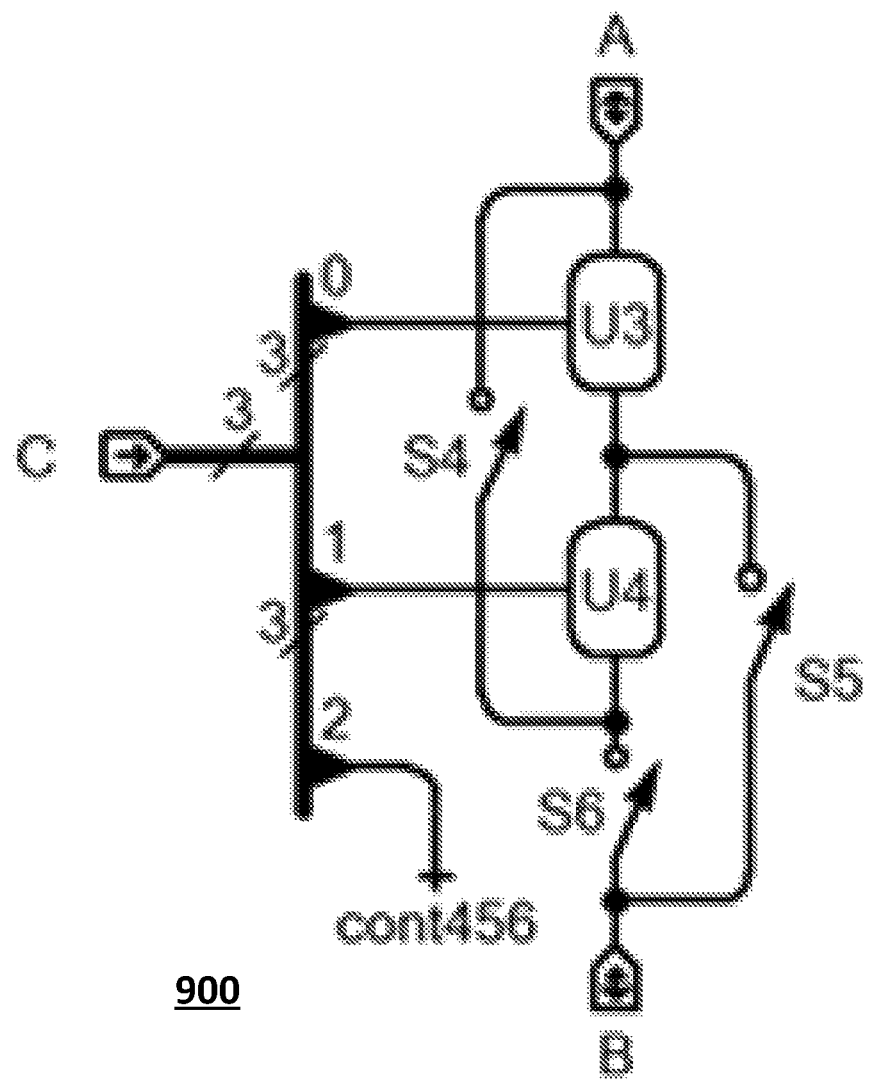
FIG. 9 is a network of two elements of the type shown in FIGS. 7 and 8.

Suppose now that the connections of FIG. 7 are repeated, but using the compound element U3 of FIG. 8 and another identical compound element U4 rather than the simple elements U1 and U2 of FIG. 7. FIG. 9 shows the resulting circuit 900, which is another compound element of a "higher level," since it is made of two other "lower level" compound elements rather than of simple elements. U3 and U4 are each compound elements, i.e., instances of the two-element compound element 700 of FIG. 7, as represented in FIG. 8, and are connected by switches S4, S5 and S6 in the same way that the two simple elements U1 and U2 in each compound element 700 are connected in FIG. 7. The higher level compound element 900 again has an input port A and an output port B, and a control port C for a control signal.

Now the control signal uses 3 bits. The switches in each of the two compound elements U3 and U4 are controlled by a bit which places the simple elements U1 and U2 within U3 and U4 in either series or parallel as above. The third control signal bit controls the switches S4, S5 and S6 in the same way that the switches in each compound element U3 and U4 are controlled as shown in FIG. 7, and places compound elements U3 and U4 themselves in either series or parallel.

Figure 10:
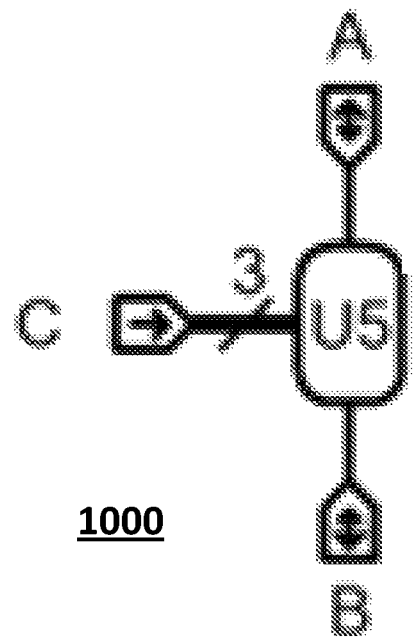
FIG. 10 is a higher level block diagram of the recursive element of FIG. 9.
Figure 11:
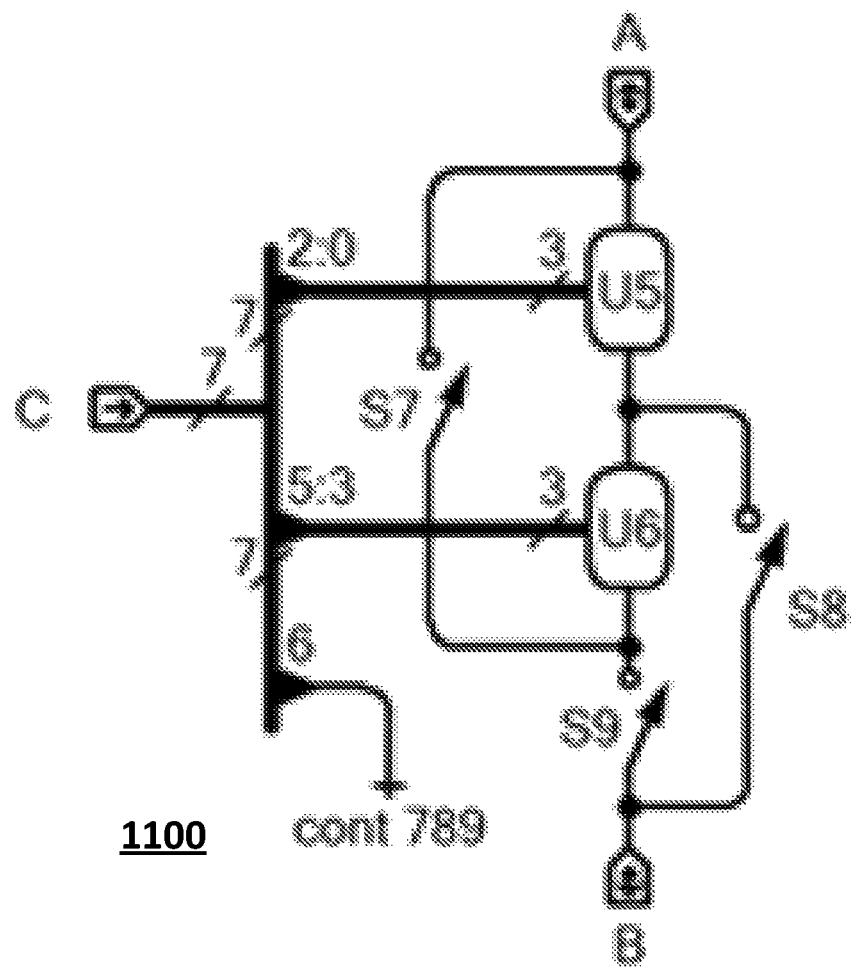
FIG. 11 is a network of two elements of the type shown in FIGS. 9 and 10.

This process can be repeated, so that compound element 900 may be shown as a higher level compound element U5 in circuit 1000 in FIG. 10, and two such compound elements U5 and U6 combined and connected by switches S7, S8 and S9 to make a still higher level compound element 1100 in FIG. 11. The difference between the representation of compound element 1100 in FIG. 11 and compound element 900 in FIG. 9 is the number of control signals, which increases when a higher level compound element is constructed.

In compound element 1100, now 7 control bits are required rather than the 3-bit control signal of FIG. 9, i.e., 3 bits to control the switches in U5, 3 bits to control the switches in U7, and a seventh bit to control switches S7, S8 and S9 to again place compound elements U5 and U6 either in series or parallel.

Figure 12:
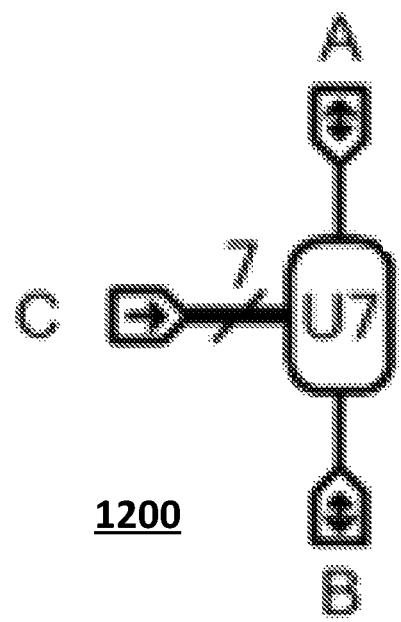
FIG. 12 is a higher level block diagram of the recursive element of FIG. 11.

As before, compound element 1100 can be represented as compound element U7 in FIG. 12, and that compound element again used to make a still higher level compound element. This recursive design, in which each compound element at any level is an instance of the compound element of the next lower level (except for the lowest, or "zero" level) can be repeated as many times as desired.

Note that in these examples each new level, or compound element (again, except the zero level which is made from two simple elements), has been made from two lower level compound elements of the same complexity, so that each compound element of a network "grows" at the same rate, i.e., the recursive "depth" of each element in a compound element is the same for each instance in any level. Such a circuit may be described as "uniform" or "balanced." This need not be the case, and in fact it may be advantageous to have different levels of recursion as will be explained.

Figure 13:
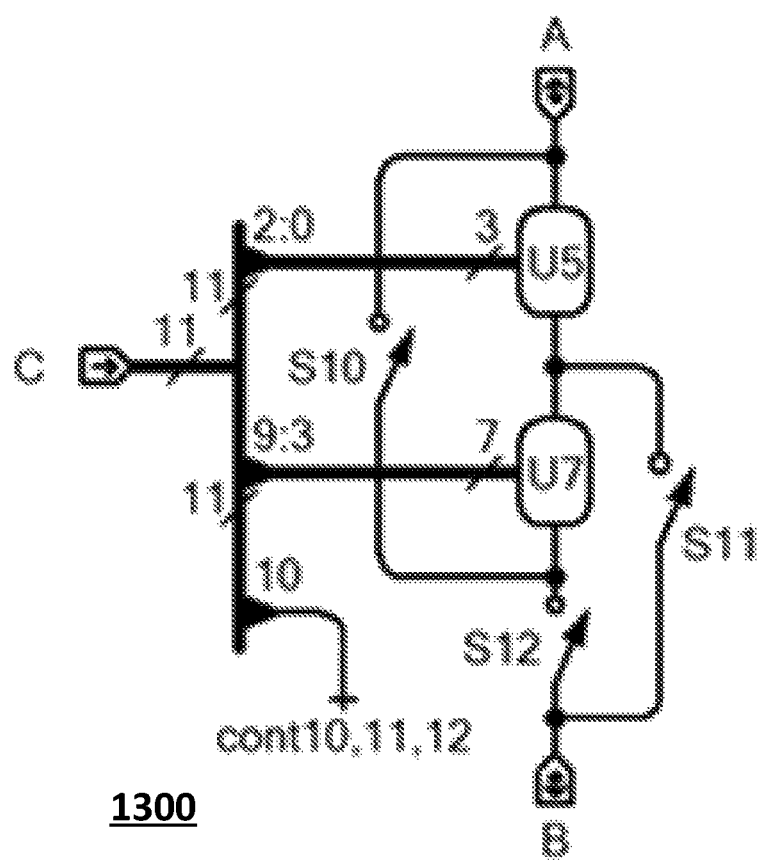
FIG. 13 is a network of two elements, one of the type shown in FIGS. 9 and 10 and the other of the type shown in FIGS. 11 and 12.

FIG. 13 illustrates this concept. If the progression described above continued, the next level of "equal level" recursion would use two instances of compound element U7 of FIG. 12. Instead, network 1300 in FIG. 13 uses one instance of compound element U7 and one instance of compound element U5 of FIG. 10 combined with switches S10, S11 and S12. Now an 11-bit control signal is used, 7 bits to control compound element U7, 3 bits to control compound element U5, and a bit to control the switches S10, S11 and S12. (It will be apparent that if two instances of U7 were used, a 15-bit control signal would be used.)

One advantage of the described embodiments is in generating a large number of possible values of a compound element. Consider the situation where each element U1 and U2 in compound element 700 of FIG. 7 has an impedance value of 1. As is well known, placing the two elements U1 and U2 in series results in an impedance of two, while placing them in parallel results in an impedance of ½.

Now consider using two such compound elements in the higher level compound element 900 of FIG. 9. The possible impedance values are as follows:

TABLE 2

| U1 | U2 | U1 + U2 | U1 ∥ U2 |
|---|---|---|---|
| 2 | 2 | 4 | 1 |
| 2 | ½ | 2.5 | 0.4 |
| ½ | 2 | 2.5 | 0.4 |
| ½ | ½ | 1 | 0.25 |

Note that when the values of U1 and U2 are different but reversed, i.e., U1 has a value of ½ rather than 2 and U2 has a value of 2 rather than ½, the same values when they are in series or parallel.

If U1 and U2 each have two possible values, as in Table 2 several of the possible combinations of placing those possible values of U1 and U2 in series or parallel result in the same values, leaving five distinct possible values of a "first level" recursive compound element 900 of FIG. 9. (Again, the compound element made of two simple elements is regarded as a zero level compound element.)

The number of possible values for any number of levels of such a recursive compound element is easily calculated, for example by the following code:

```
defun impedance (depth)
  (labels ((recurse
             (level)
             (if (= level 0)
                 '(1/2 2)
                 (remove-duplicates
                  (loop
                     with below = (recurse (1- level))
                     for z1 in below
                     append
                     (loop for z2 in below
                           collect (+ z1 z2)
                           collect (/ (+ (/ z1) (/ z2)))))))))
    (sort (recurse depth) #'<)))
```

Such a calculation results in the following numbers of possible values for a recursive compound element of equal depth for up to four levels:

TABLE 3

| Depth | Number of values |
|---|---|
| 0 | 2 |
| 1 | 5 |
| 2 | 24 |
| 3 | 443 |
| 4 | 146,610 |

It will be seen that the number of possible values increases very rapidly as the number of levels of recursion increases; with only 4 levels, over 146,000 values are possible using only basic elements U1 and U2 each having a value of 1, placed in series or parallel in each zero level compound element.

As above, in each compound element the two lower level compound elements need not always be of the same depth, such as is shown in FIG. 13. One sample of code that calculate the number of possible values for compound elements of different depth is as follows (in this case, one compound element of 3 levels and one compound element of 2 levels):

```
(defun show-two (&optional (z1s (impedance 3)) (z2s
  (impedance 2)))
  (remove-duplicates
   (loop
      for z1 in z1s
      append
      (loop for z2 in z2s
            collect (+ z1 z2)
            collect (/ (+ (/ z1) (/ z2)))))))
```

This calculation shows that combining a second level compound element with a third level compound element will result in 12,518 differing values. As seen in Table 3 above, using two compound elements of three levels each only results in 443 possible values. Thus, the use of different levels of recursion can provide a much larger number of possible values than structures of uniform depth.

Figure 14:
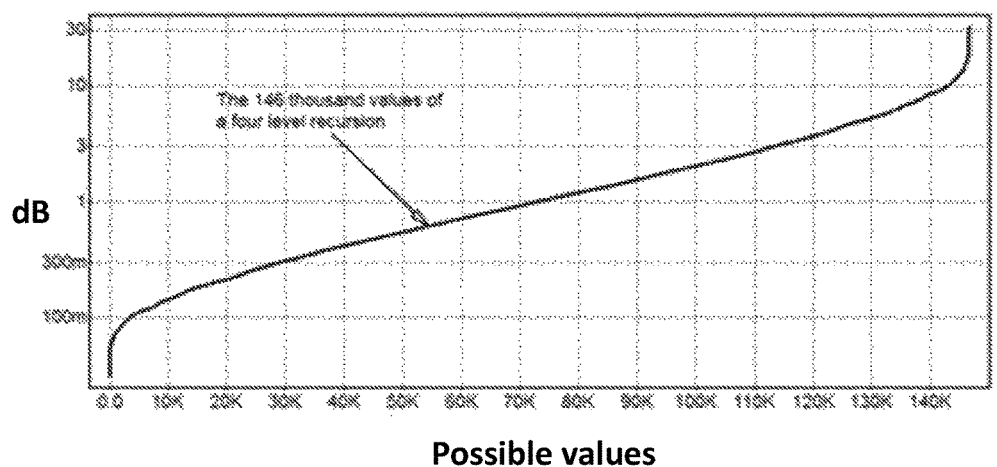
FIG. 14 is a graph of possible values of an adjustable element having four levels of recursion according to one embodiment.

The available values for any particular compound element may be plotted to show the range of values. For example, FIG. 14 is a plot of the 146,610 values of a four level, equal depth recursion. The vertical Y-axis is logarithmic, and it can be seen that except at the extremes, most of the values form a nearly uniform logarithmic progression, i.e., the graphed line of the possible values forms a nearly straight line across most of the values other than at the high and low ends.

Figure 15:
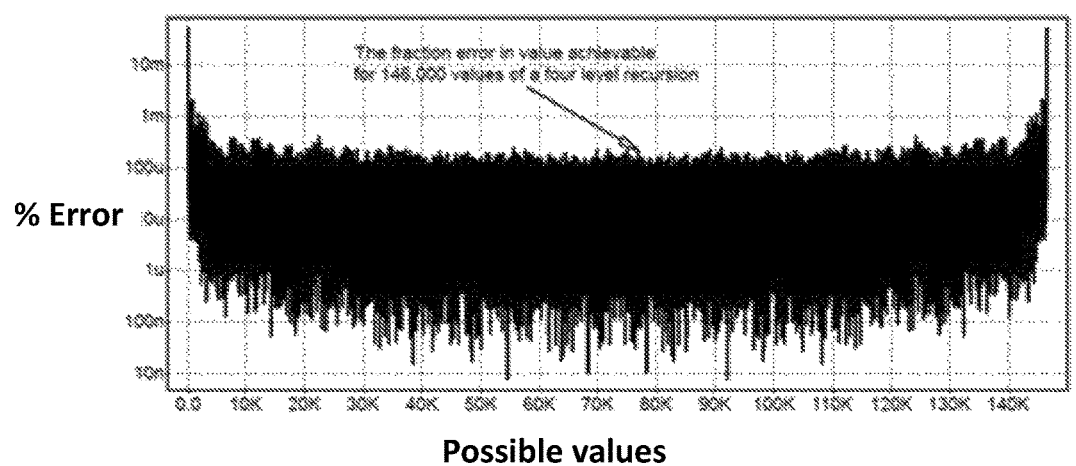
FIG. 15 is a graph of the error between any desired value of impedance and the next available value of an adjustable element having four levels of recursion according to one embodiment.

FIG. 15 is a plot of the maximum error between any desired value in the range of absolute values covered by the 146,610 possible values shown in FIG. 14 and the closest possible value. Again apart from the very extremes, the difference between any arbitrary desired value and the closest possible value is less than 1 part in 1000. In the center range of the graph of FIG. 15, the error is always no more than 0.003%. The downward "spikes" in FIG. 15 are those situations in which the arbitrary desired values are almost exactly the same as the closest possible values.

Figure 16:
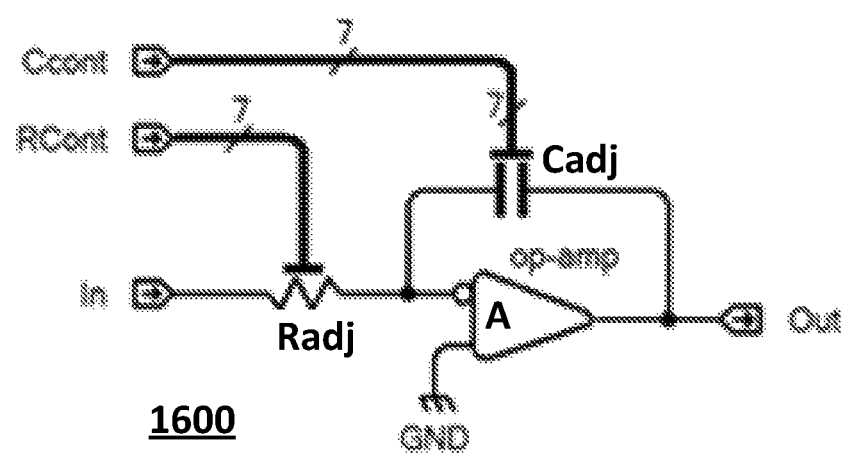
FIG. 16 is a diagram of an integrator circuit incorporating an adjustable resistor and adjustable capacitor according to one embodiment.

FIG. 16 shows how the present approach may be incorporated into the integrator circuit of FIG. 1. The resistor R1' and capacitor C1' of the integrator circuit 100 of FIG. 1 are now adjustable components Radj and Cadj, which are compound elements constructed in the recursive manner described above. In FIG. 16, it is assumed that Radj and Cadj are each compound elements having two levels of recursion as shown in circuit 1100 of FIG. 11. Radj is a recursive compound element in which the simple elements U1 and U2 are all resistors, while Cadj is a recursive compound element in which U1 and U2 are all capacitors. Since each compound element is recursive with two levels, each uses a seven-bit control signal; these are shown by the 7-bit control signal buses Rcont and Ccont respectively.

The use of these recursive compound elements to replace the fixed values of R1' and C1' in circuit 100 of FIG. 1 allows for adjustment of the integrator circuit 1600 at run time. In addition, as mentioned above the recursive compound elements have advantages over the prior art adjustable circuits shown in FIGS. 2 to 5 above.

Because Radj and Cadj in FIG. 16 are adjustable approximately logarithmically as above (which appears to be linear on a logarithmic graph, such as seen in FIG. 15), the error between any specific desired value and the closest actual value is relatively constant as a fraction of the desired value throughout the range, and much less than some of the large typical errors allowed by the prior art as described above.

Further, because each compound element is composed of two-port elements and remains itself a two-port element, any current into compound element Radj must go out and into the op-amp A. Thus, no current is lost to ground. For these reasons, the noise gain is lower in the integrator circuit 1600 of FIG. 16 than, for example, in circuits 400 and 500 of FIGS. 4 and 5.

Figure 17:
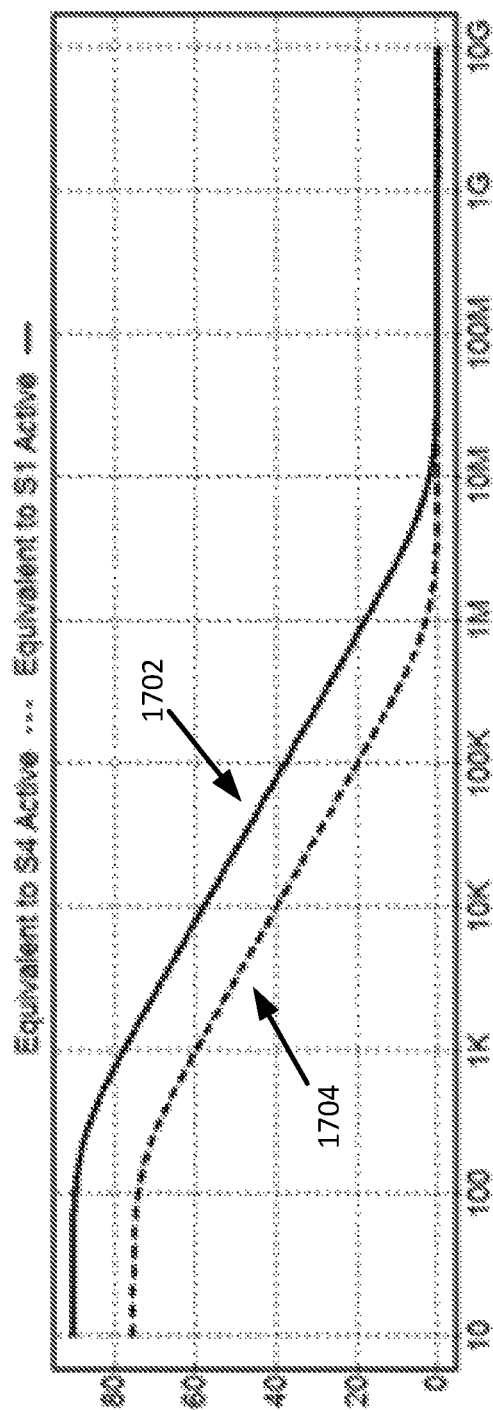
FIG. 17 is a graph of a comparison of noise in an integrator circuit in two different operating conditions according to one embodiment.

FIG. 17 is a graph of the noise gain of integrator circuit 1600 of FIG. 16 set to two configurations, one in which the value of Radj is set to ¼ R, and the second in which Radj is set to 2R, where R is a nominal value, i.e., an 8 to 1 ratio. These two configurations correspond to the two configurations of the prior art circuit 400 of FIG. 4 that are used in the graph of FIG. 6.

The solid line curve 1702 of FIG. 17 is the same as the solid line curve 602 of FIG. 6, corresponding to the case where switch S1 passes the signal to op-amp A in circuit 500 of FIG. 5. Recall that in FIG. 6, the dashed line curve 604, corresponding to the case where instead switch S4 passes the signal to op-amp A, i.e., R1 has a value 8 times higher, always has more noise.

Now, however, the dashed line curve 1704 in FIG. 17 representing the case where Radj has a higher value is always below the solid line, indicating that there is now less noise for the greater value of Radj. In fact, as seen in FIG. 17, there is about 20 db less noise across almost the entire bandwidth of the integrator, all the way from 10 hertz to nearly 1 megahertz. (Again, the noise essentially disappears at about 10 megahertz in any case.)

Figure 18:
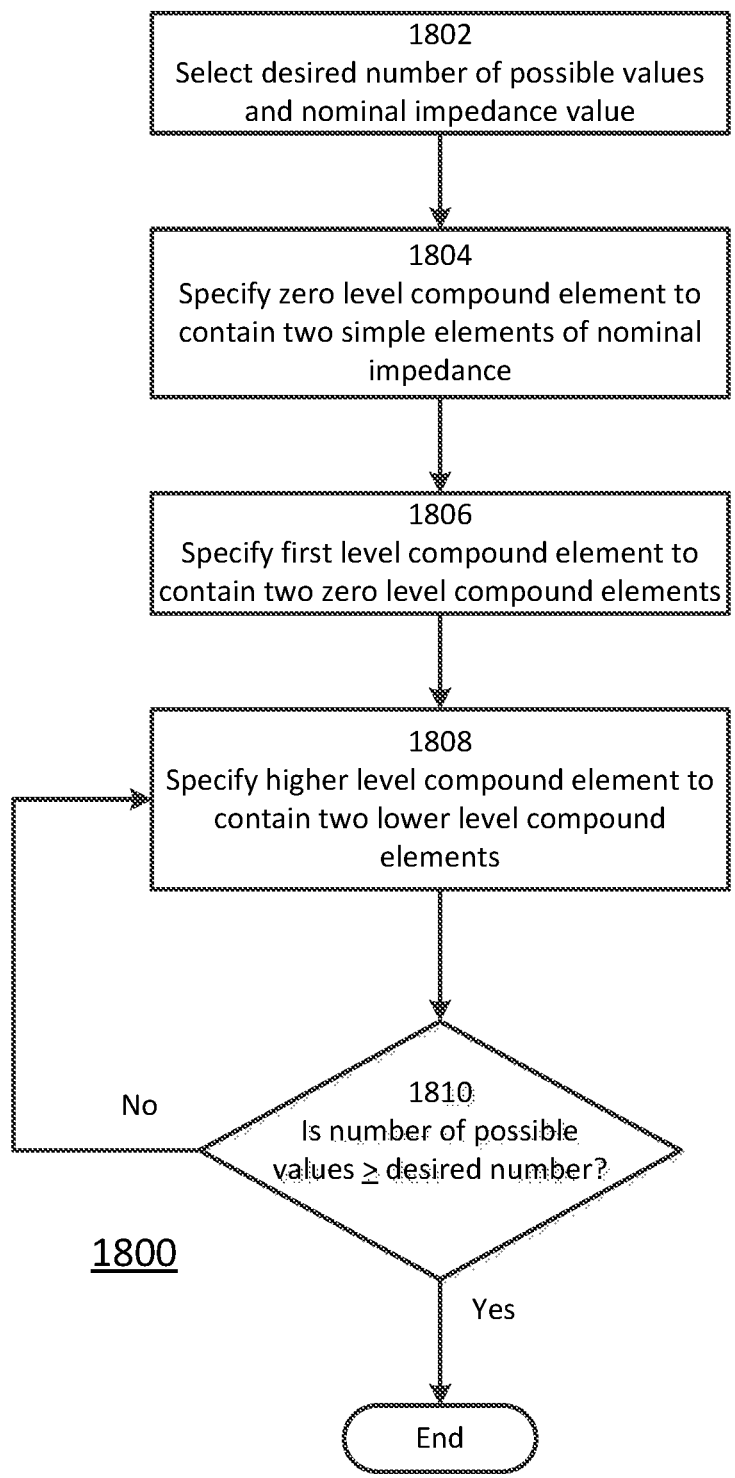
FIG. 18 is a flowchart of one embodiment of designing an adjustable component according to one embodiment.

FIG. 18 is a flowchart of one embodiment of designing an adjustable component according to one embodiment. The method may, for example, be performed by a computer or processor, including instructions such as shown above for calculating the number of possible values of a component having a certain number of levels of hierarchy or recursion as described herein.

At step 1802, a desired number of possible values of the adjustable component is selected. As above, one of skill in the art will be able to select a desired number of possible values so that the maximum error between a desired value for the component and the closest possible value is within an acceptable margin of error.

Also at step 1802, a nominal impedance is selected for the simple elements at the zero level of hierarchy as described herein. Again, one of skill in the art will be able to select an appropriate nominal impedance so that the range of possible values which are evenly spaced logarithmically covers the desired operating range of the component.

Next, at step 1804, the zero level compound element is specified to contain two simple elements of the nominal impedance, switches, and a control input for receiving a control signal as described above with respect to compound element 700 of FIG. 7.

At step 1806, the first level compound element is specified to contain two zero level compound elements, switches, and a control input for receiving a control signal as described above with respect to compound element 900 of FIG. 9.

At step 1808, a higher level compound element is specified to contain two lower level compound elements, switches and a control input for receiving a control signal as described above with respect to, for example, compound element 1100 of FIG. 11 or compound element 1300 of FIG. 13. As described above, the higher level compound element can be specified to contain two instances of the compound elements at the immediately lower level as in compound element 1100 of FIG. 11. Alternatively, the higher level compound element can be specified to contain one instance of the compound element at the immediately lower level and one compound element at a level at least two levels below the higher level as in compound element 1300 of FIG. 13.

At step 1810 a determination is made as to whether the number of possible values of the higher level is equal to or greater than the number of desired possible values. If there are enough possible values, the adjustable component is designed and the method terminates. If there are not enough possible values, the method returns to step 1808 to specify a still higher level compound element according to the same procedure described above.

It can thus be seen that using adjustable components constructed by using recursive compound elements allows for run-time adjustment of the components with significantly less error, wasted power and noise as compared to the prior art solutions described above.

The disclosed system and method has been explained above with reference to several embodiments. Other embodiments will be apparent to those skilled in the art in light of this disclosure. Certain aspects of the described method and apparatus may readily be implemented using configurations or steps other than those described in the embodiments above, or in conjunction with elements other than or in addition to those described above.

It will be apparent to one of skill in the art that many variations of the described embodiments are possible. For example, as described herein each network of two components (either single or compound) uses only a single control bit to place the two components either in series or in parallel.

In other embodiments, it might be desirable to use more of the possible values of a compound element as shown in Table 1. As above, if one wishes to use all five possible values, more than a single control bit will be used. One way to use all five values of a compound element at any level is by using a 3-bit control signal rather than a single bit for that level. Further, since only five of the eight possible values of a 3-bit control signal are used for a given level, if the compound element has more than one level, it is possible to "consolidate" the number of bits used in the various control signals by determining the total number of values of the compound element and using a control signal having only enough bits to accommodate those values, rather than using a separate 3-bit control signal for each compound element found within the overall compound element.

These and other variations upon the embodiments are intended to be covered by the present disclosure, which is limited only by the appended claims.

What is claimed is:

1. An adjustable circuit component comprising:
   a first two-port compound element containing first and second simple elements each having an impedance, a first plurality of switches that are configured to be separately opened or closed so as to connect the first and second simple elements either in series or in parallel, and a first control input for accepting a first control signal that causes the first plurality of switches to be opened or closed;
   a second two-port compound element containing third and fourth simple elements each having an impedance, a second plurality of switches that are configured to be separately opened or closed so as to connect the third and fourth simple elements either in series or in parallel, and a second control input for accepting a second control signal that causes the second plurality of switches to be opened or closed; and
   a third two-port compound element containing the first and second two-port compound elements, a third plurality of switches that are configured to be separately opened or closed so as to connect the first and second two-port compound elements either in series or in parallel, and a third control input for accepting a third control signal that causes the third plurality of switches to be opened or closed.

2. The adjustable circuit component of claim 1 wherein the first, second, third and fourth simple elements are resistors.

3. The adjustable circuit component of claim 1 wherein the first, second, third and fourth simple elements are capacitors.

4. The adjustable circuit component of claim 1 wherein the first, second, third and fourth simple elements are inductors.

5. The adjustable circuit component of claim 1 wherein the first, second, third and fourth simple elements are FETs.

6. The adjustable circuit component of claim 1 wherein the first, second and third control inputs each accept a single bit for the first, second and third control signals, respectively.

7. The adjustable circuit component of claim 1 further comprising:
   a fourth two-port compound element containing fifth and sixth simple elements each having an impedance, a fourth plurality of switches that are configured to be separately opened or closed so as to connect the fifth and sixth simple elements either in series or in parallel, and a fourth control input for accepting a fourth control signal that causes the fourth plurality of switches to be opened or closed;
   a fifth two-port compound element containing seventh and eighth simple elements each having an impedance, a fifth plurality of switches that are configured to be separately opened or closed so as to connect the seventh and eighth simple elements either in series or in parallel, and a fifth control input for accepting a fifth control signal that causes the fifth plurality of switches to be opened or closed;
   a sixth two-port compound element containing the fourth and fifth two-port compound elements, a sixth plurality of switches that are configured to be separately opened or closed so as to connect the fourth and fifth two-port compound elements either in series or in parallel, and a sixth control input for accepting a third control signal that causes the sixth plurality of switches to be open or closed; and
   a seventh two-port compound element containing the third and sixth two-port compound elements, a seventh plurality of switches that are configured to be separately opened or closed so as to connect the third and sixth two-port compound elements either in series or in parallel, and a seventh control input for accepting a seventh control signal that causes the seventh plurality of switches to be open or closed.

8. The adjustable circuit component of claim 1 further comprising:
   a fourth two-port compound element containing fifth and sixth simple elements each having an impedance, a fourth plurality of switches that are configured to be separately opened or closed so as to connect the fifth and sixth simple elements either in series or in parallel, and a fourth control input for accepting a fourth control signal that causes the fourth plurality of switches to be opened or closed; and
   a fifth two-port compound element containing the third and fourth two-port compound elements, a fifth plurality of switches that are configured to be separately opened or closed so as to connect the third and fourth two-port compound elements either in series or in parallel, and a fifth control input for accepting a fifth control signal that causes the fifth plurality of switches to be opened or closed.

9. A method of designing an adjustable circuit component, comprising the steps of:
   selecting a desired number of possible values of the adjustable circuit component;
   selecting a nominal impedance value;
   specifying a zero level two-port compound element containing first and second simple elements each having an impedance of the nominal impedance value, a first plurality of switches that are configured to be separately opened or closed so as to connect the first and second simple elements either in series or in parallel, and a first control input for accepting a first control signal that causes the first plurality of switches to be opened or closed;
   specifying a first level two-port compound element containing two instances of the zero level compound element, a second plurality of switches that are configured to be separately opened or closed so as to connect the two zero level compound elements either in series or in parallel, and a second control input for accepting a second control signal that causes the second plurality of switches to be opened or closed;
   specifying a higher level two-port compound element containing two instances of a lower level compound element, a third plurality of switches that are configured to be separately opened or closed so as to connect the two lower level compound elements either in series or in parallel, and a third control input for accepting a third control signal that causes the third plurality of switches to be opened or closed;
   repeating the step of specifying a higher level two-port compound element containing two instances of a lower level compound element until the number of possible values of the highest level compound element is equal to or greater than the desired number of possible values of the adjustable circuit component.

10. The method of designing an adjustable circuit component of claim 9 wherein the step of specifying a higher level two-port compound element further comprises specifying the higher level compound element to contain two instances of the immediately lower level compound element.

11. The method of designing an adjustable circuit component of claim 9 wherein the step of specifying a higher level two-port compound element further comprises specifying the higher level compound element to contain one instance of the immediately lower level compound element and one instance of a compound element at least two levels lower than the higher level compound element.

* * * * *